OVERLAPPING GATE STRUCTURE FIELD EFFECT SEMICONDUCTOR DEVICE

Filed June 15, 1962 2 Sheets-Sheet 1

INVENTOR.
JOHN R. WILLIAMS
BY David A. Rich
ATTORNEY

May 3, 1966 J. R. WILLIAMS 3,249,828

OVERLAPPING GATE STRUCTURE FIELD EFFECT SEMICONDUCTOR DEVICE

Filed June 15, 1962 2 Sheets-Sheet 2

INVENTOR.
JOHN R. WILLIAMS
BY David A. Rich
ATTORNEY

United States Patent Office 3,249,828
Patented May 3, 1966

3,249,828
OVERLAPPING GATE STRUCTURE FIELD EFFECT SEMICONDUCTOR DEVICE

John R. Williams, Natick, Mass., assignor to Crystalonics, Inc., Cambridge, Mass., a corporation of Massachusetts Filed June 15, 1962, Ser. No. 202,908
5 Claims. (Cl. 317—234)

This invention relates generally to semiconductor devices. More particularly, the invention relates to so-called field effect transistors.

The field effect transistor was first proposed by Shockley and is disclosed in Patent Number 2,744,970, issued May 8, 1956, entitled Semiconductor Signal Translating Devices. The theoretical advantages of the field effect transistor over other transistors such as the PNP or NPN type junction transistors has long been well accepted. The junction transistor, for example, is limited to a low input impedance while producing a high output impedance. In contrast, the field effect transistor is more nearly like a pentode vacuum tube in operating characteristics. Thus very high input impedances are possible with the field effect transistor. The analogy between the field effect transistor and the vacuum tube is so strong that the terminology of cathode, grid and plate is used herein to depict its various components.

While the field effect transistor was invented over ten years ago and its advantages widely appreciated, commercial success has been notably lacking. It turns out that structurally the field effect transistor presents severe problems tending to inhibit the ease of manufacture and reproducibility in the course of manufacture.

As proposed by Shockley, the field effect transistor includes, for example, a bar of N-type material with ohmic connections in the ends and a rectifying PN junction disposed intermediate the ends. Shockley termed one end the source, corresponding with the term cathode and the other end the drain, corresponding with the plate. He termed the rectifying junction a gate, corresponding with the term grid. Briefly, a current is caused to pass between the cathode and plate. Back-biasing of the grid produces a depletion layer and correspondingly a field which varies in depth, tending to vary the resistance of the N-type material and hence the current flow. The effective area of field control in an operable device must be relatively small, for example, of the order of $\frac{1}{1000}$ of an inch. In accordance with prior art semiconductor technology, it is extremely difficult to obtain such a finely controlled region at all and heretofore has been essentially impossible to reproduce. A further problem presented by the Shockley device is a relatively high noise level which is internally generated and limits its effective application.

In the recent prior art, several structures have been proposed whereby ready manufacture is facilitated and desirably small current paths are provided. In Patent Number 2,829,075, entitled Field Controlled Semiconductor Devices and Methods of Making Them, issued to J. I. Pankove on April 1, 1958, a wafer structure is disclosed utilizing a pair of oppositely disposed rectifying junctions or grids. That structure is distinguishable from the present invention in that the grids appear to be congruently aligned in registration.

In contrast, the grids of the present invention are overlapped to provide the desired small current paths.

Other special field effect transistors are described and disclosed in Patent Number 2,921,265, entitled Very High Frequency Field-Effect Transistors, issued to S. Teszner on January 12, 1960, Patent Number 2,939,057, entitled Unipolar Field-Effect Transistors, issued to S. Teszner on May 31, 1960, and Patent Number 2,987,659, entitled Unipolar Field Effect Transistor, issued to S. Teszner on June 6, 1961. Teszner utilizes a rod-shaped transistor having a dumbell-shape cross section in order to increase the sensitivity and frequency effects. In contrast, the transistors of the present invention are disc-shaped. Other transistors, as shown in Patent Number 2,869,055, entitled Field Effect Transistor, issued to R. N. Noyce on January 13, 1959, Patent Number 2,900,531, entitled Field-Effect Transistor, issued to J. T. Wallmark on August 18, 1959, Patent Number 2,952,804, entitled Plane Concentric Field-Effect Transistors, issued to J. I. Franke on September 13, 1960, Patent Number 2,975,344, entitled Semiconductor Field Effect Device, issued to H. A. R. Wegener on March 14, 1961, Patent Number 2,994,811, entitled Electrostatic Field-Effect Transistor Having Insulated Electrode Controlling Field in Depletion Region of Reverse-Biased Junction, issued to B. Senitzky on August 1, 1961, and Patent Number 2,997,-634, entitled Manufacture of Field-Effect Transistors, issued to J. I. Franke on August 22, 1961, disclose various structures modifying the original field effect transistor concept.

All of the transistors, however, suffer from excessive noise, and none of them is characterized by substantial commercial success. In contrast with the transistors disclosed above, the field effect transistor of the present invention exhibits an exceedingly low noise figure, for example, of the order of 0.4 db. This noise figure is comparable to thermal noise levels.

It is, therefore, an object of the present invention to provide an improved field controlled, semiconductor device.

A further object of the invention is to provide an improved field controlled, semiconductor device exhibiting readily reproducible small current paths.

Still another object of the invention is to provide an improved field controlled, semiconductor device exhibiting extremely low internal noise characteristics.

Yet another object of the invention is to provide an improved field controlled, semiconductor device useful as a mixer.

In accordance with the invention there is provided a field controlled, semiconductor device. The device includes a base of semiconductive material. A cathode and an anode are connected to the base. A pair of oppositely disposed, field controlling rectifying junctions are formed in the base between the cathode and anode. The junctions have adjacent surfaces in overlapping relation to provide a field control region in the base extending in a current direction less than either one of the rectifying junctions.

In accordance with the preferred mode, one of the junctions is annular and circumscribes the anode. In another form of the invention, the cathode is annular and circumscribes the anode and a junction. In still another form of the invention, there is provided a field control semiconductor device formed of a base of semiconductive material and having a cathode and anode connected to the base. A field controlling rectifying junction is formed in the base between the cathode and the anode. The base is constricted in the vicinity of the junction. The constriction overlaps the junction to provide a field controlling region in the base extending in a current direction less than the rectifying junction.

In yet another form of the invention there is provided a field controlled, semiconductor device formed of a base of semiconductive material and having a cathode and an anode connected to the base. A pair of field controlling, rectifying junctions are formed in the base between the cathode and anode and have a low resistance interconnection through the base to provide a field control region in the base.

Other and further objects of the invention will be apparent from the following description of the invention taken in conjunction with the accompanying drawings, and its scope will be pointed out in the appended claims.

In the drawings:

FIG. 1 is a perspective view partly in section of a field controlled semiconductor device embodying the invention;

FIG. 2 in an enlarged exploded view of the device in FIG. 1;

Figure 1:
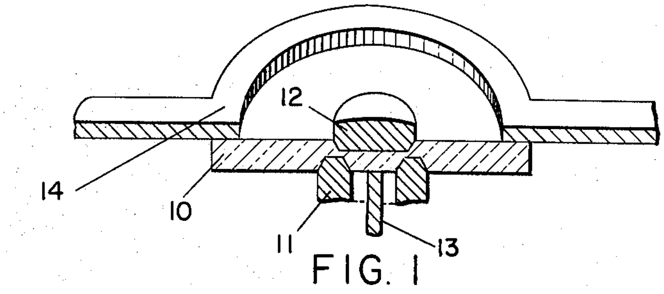
Figure 2:
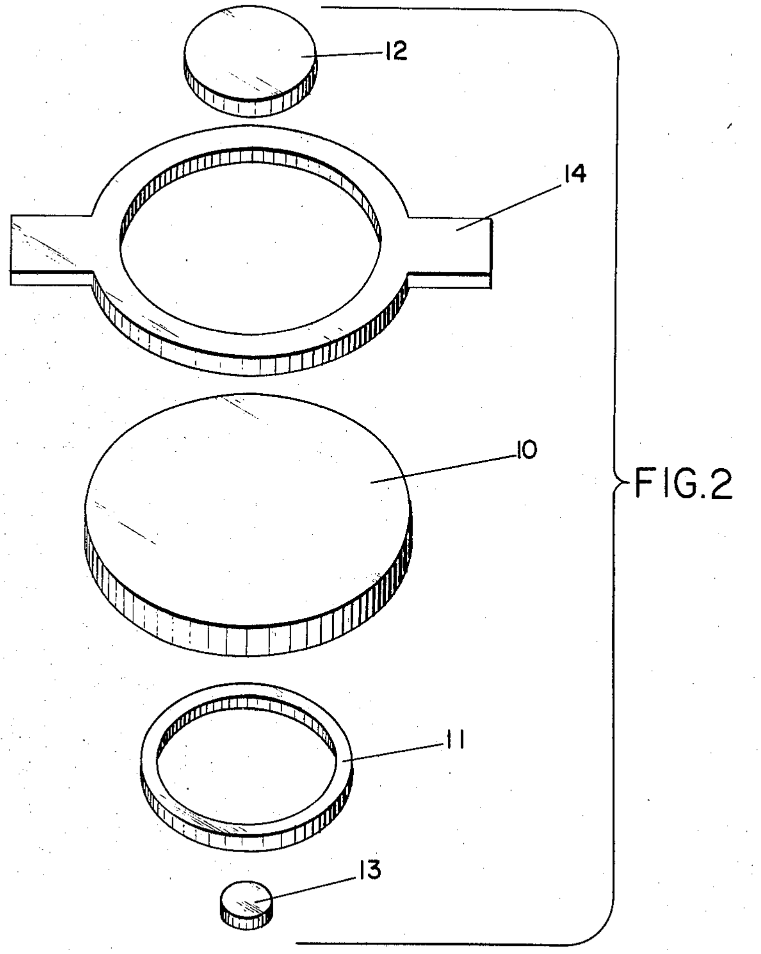

*Description and explanation of the device in FIGURES 1 and 2*

Referring now to the drawings and in particular reference to FIGS. 1 and 2, there is here illustrated a field controlled semiconductor device or field effect transistor. A disc-shaped base 10 form, for example, from N-type silicon carries a pair of oppositely disposed grids 11 and 12 in overlapping relation. The grid 11 is annular and circumscribes an anode 13 ohmically connected to the base 10. An annular cathode 14 circumscribes the disc-shaped grid 12. The grids provide a pair of field controlling, rectifying junctions and are preferably formed by alloying P-type material to the base between the cathode and anode. Note that adjacent surfaces are in overlapping relation to provide a field control region in the base. Considering the direction of current flow to be from the cathode to the plate or anode, the region extends in the base along the current direction a distance less than that of either one of the rectifying junctions. A D.C. biasing source connected between the grid 12 and the cathode back biases the grids 11 and 12 to provide depletion layers in the vicinity of the grids in the base material in a manner similar to that of a pentode. A signal is introduced between the grid and cathode. The resistance of the base material in the region of overlapping varies with the degree of back biasing. With a sufficient voltage, for example −5 volts on the grid, current flow from cathode to plate can be extinguished or cut off with 0 volts on the grid maximum current flows.

Internal noise is generated by surface barrier effects which accompany the physical proximity of the fields with the surface of the base material. The annular structure terminates the fields within the base material and avoids surface barrier proximity effects. This results in the development of a minimum of internal noise. Noise figures as low as 0.1 db have been realized with devices embodying the invention.

Figure 3:
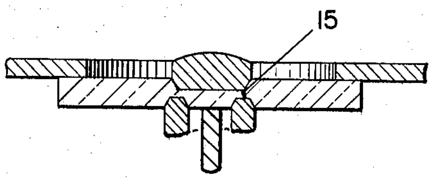
FIG. 3 is a sectional view illustrating a modification of the device in FIG. 1.

*Description and explanation of the device in FIGURE 3*

Referring now to FIG. 3, there is here illustrated a field effect transistor similar to that in FIG. 1. Here, however, the grids 11 and 12 are internally interconnected through the base material by means of a low resistance interconnection 15. With this structure the transistor is particularly useful as an amplifier.

Figure 4:
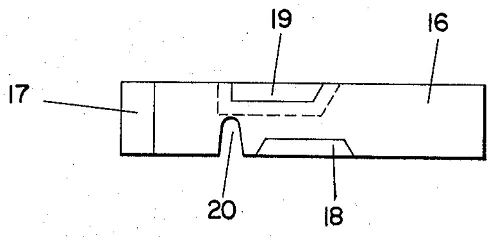
FIG. 4 is a sectional view illustrating yet another modification of the device in FIG. 1.

*Description and explanation of the device in FIGURE 4*

Referring now to FIG. 4, there is here illustrated a field controlled, semiconductor device having a base 16 to which are connected a cathode 17 and anode 18. A rectifying junction or grid 19 is formed in the base between the cathode and the anode or plate. A constriction 20 in the base adjacent the plate provides a small current path in the base.

It will be apparent from the above that the field effect transistor of the present invention has broad application. This transistor incorporates all the theoretical advantages of pentode-like operation while being producible and exhibiting extremely low noise characteristics.

While there has hereinbefore been presented what are at present the preferred embodiments of the invention, it will be understood that all those modifications and variations which fall fairly within the scope of the invention shall form a part of the invention.

What is claimed is:

1. A field controlled, semiconductor device, comprising:

a base of semiconductive material of a first conductivity type;

a cathode connected to said base;

an anode connected to said base; and a pair of field controlling, grid electrodes having a second conductivity type opposite said first conductivity type and formed in rectifying junction with said base between said cathode and anode on opposing surfaces of said base, said grid electrodes having a low resistance interconnection through said base to provide a field control region in said base.

2. A field controlled, semiconductor device, comprising:

a base of semiconductive material of a first conductivity type;

an annular cathode ohmically connected to said base;

an anode ohmically connected to said base; and a pair of field controlling, grid electrodes having a second conductivity type opposite said first conductivity type and formed in rectifying junction with said base between said cathode and anode on opposing surfaces of said base, said grid electrodes having a low resistance interconnection through said base to provide a field control region in said base, one of said grid electrodes surrounding said anode.

3. A field controlled, semiconductor device, comprising:

a base of semiconductive material;

a cathode connected to said base;

an anode connected to said base;

a pair of oppositely disposed field controlling, re.tifying junctions formed in said base between said cathode and anode and having adjacent surfaces in offset relation on opposite sides of said base to provide a field control region in said base thereby allowing the available conduction path between said anode and cathode to be reduced in cross-sectional area more readily to control the effective channel of conduction by reverse bias on said field controlling, rectifying junctions; and conductive means extending through said base for connecting said field controlling junctions together.

4. The device of claim 3, wherein:

said cathode is annular, and said junction is annular and circumscribes said anode.

5. The device of claim 3, wherein:

said base is formed of N-type single type silicon and each said rectifying junction is PN type.

References Cited by the Examiner

UNITED STATES PATENTS

| | | | |
|---|---|---|---|
| 2,790,037 | 4/1957 | Shockley | 317—235 |
| 2,974,236 | 3/1961 | Pankove | 317—235 X |
| 3,017,520 | 1/1962 | Maupin | 317—235 X |
| 3,074,003 | 1/1963 | Lusher | 317—235 |
| 3,081,421 | 3/1963 | Roka | 317—234 |
| 3,150,299 | 9/1964 | Noyce | 317—235 X |

FOREIGN PATENTS

| | | |
|---|---|---|
| 1,037,293 | 9/1953 | France. |
| 1,094,884 | 12/1960 | Germany. |

JAMES D. KALLAM, *Acting Primary Examiner.*

JOHN W. HUCKERT, *Examiner.*

R. F. POLISSACK, *Assistant Examiner.*